United States Patent [19]

Michiels et al.

[11] Patent Number: 5,452,039
[45] Date of Patent: Sep. 19, 1995

[54] METHOD AND APPARATUS FOR CALCULATING THE AREA OF MOVING SHEET MATERIAL USEFUL IN PHOTOGRAPHIC DEVELOPMENT

[75] Inventors: Emiel Michiels, Antwerp; Jan Claes; Marc Scheerders, both of Mortsel, all of Belgium

[73] Assignee: Agfa-Gevaert N. V., Mortsel, Belgium

[21] Appl. No.: 76,159

[22] Filed: Jun. 14, 1993

[30] Foreign Application Priority Data

Aug. 11, 1992 [EP]  European Pat. Off. ......... 92202463.3

[51] Int. Cl.⁶ .............................................. G03D 13/00
[52] U.S. Cl. ................................................... 354/298
[58] Field of Search ............... 354/319, 324, 337, 339, 354/340, 298, 334; 355/55, 56, 308–311

[56] References Cited

U.S. PATENT DOCUMENTS 4,506,969  3/1985  Baker ................................. 354/298

*Primary Examiner*—D. Rutledge
*Attorney, Agent, or Firm*—William J. Daniel

[57] ABSTRACT

The area of moving rectangular sheet material, such as exposed photographic material needing photographic development, is calculated by advancing the sheet material at a known speed along a straight path with one axis, e.g. the length, of the material aligned with the path pass dual sensors. The first sensor determines the length of the sheet material, e.g. by measuring the time interval for the leading and trailing edges of the material to pass the sensor, from which in conjunction with the known speed of advance, the length can be calculated. The second sensor is elongated and extends angularly across the path of advance at a fixed bias angle $\alpha$ and measures the time interval for the leading and trailing corners (relative to the angular orientation of the second sensor) to pass the second sensor, from which the distance separating such corners along the path can be calculated. From the difference between the latter distance and the length and the bias angle, the width of the sheet material can be calculated by a basic trigonometric function and the area is the multiple of the length and width. Preferably, the second sensor is sufficiently long to accommodate different sizes of sheet material.

7 Claims, 2 Drawing Sheets

METHOD AND APPARATUS FOR CALCULATING THE AREA OF MOVING SHEET MATERIAL USEFUL IN PHOTOGRAPHIC DEVELOPMENT

BACKGROUND OF INVENTION
FIELD OF INVENTION

This invention relates to method apparatus and useful for the development of exposed photographic material, and in particular to method and apparatus useful for developing lithographic off-set printing plates.

BACKGROUND OF INVENTION

In an apparatus or system for the development of aluminium lithographic printing plates of the type disclosed in EP-A-410500 it is advantageous to maintain the strength of the processing liquids within specified limits so as to maintain high quality printing plates, and reduce waste products.

This can be achieved by constantly topping up a process liquid reservoir or bath by automatic means as photographic materials is processed.

The exhaustion of the chemicals in the baths can normally be directly correlated with the amount of processed material passing through the apparatus. This in turn is directly related to the surface area of the material being processed.

A known surface area detection means comprises one sensor for sensing the length of processed material, and an array of sensors to determine the width of the material. Such a system is relatively expensive since to measure random material widths with precision requires a large number of sensors. For example, off-set printing plates may vary in width from 225 mm to 800 mm and if it is necessary to measure all possible combinations of standard material widths from 200 mm upwards within a 10% accuracy band some 30 sensors are necessary, and within a 20% accuracy band some 16 sensors are necessary.

OBJECT OF THE INVENTION

The present invention provides a simple ways of calculating the surface area of processed material which is suitable for random rectangular formats and uses a minimum number of sensors.

STATEMENT OF INVENTION

Accordingly there is provided method apparatus and useful for the development of exposed photographic sheet material said apparatus including conveyor means to advance the sheet material through the apparatus, a device for the calculation of the surface area of rectangular photographic sheet material processed, said device including first and second sensor means operated by the advance of the material and a process means for processing the information, the first sensor means for determining longitudianl dimensions of the sheet material in the direction of advance, and characterised in that the second sensor means is arranged at a bias angle relative to the direction of advance, and is operable to sense the front edge of the material on one lateral side of the sheet, and the back edge of the other lateral side of the sheet, and the process means processed signals from the two sensor means to produce an output signal indicative of the calculated surface area.

Preferably the method apparatus and useful is for the processing of exposed aluminium lithographic off-set printing plates. Preferably the second sensor means is independant of the first sensor means, and prefarably the second sensor means comprises a signal generator operated by a blade arranged to extend across substantially the whole width of the apparatus at said bias angle, the blade sensing the presence of sheet material and swithching the signal generator on or off as required indicating the presence or absence of said sheet material.

Preferably the apparatus includes a sheet feed means, and a feed sensor which senses when the sheet is substantially contralised relative to the sheet feed means, the feed sensor being operable to prevent the operation of the feed sheet means if the presence of a sheet is not sensed.

BRIEF DESCRIPTION OF DRAWINGS

The invention will be described by way of example and with reference to accompanying drawings in which.

DETAILED DESCRIPTION OF THE INVENTION

Figure 1:
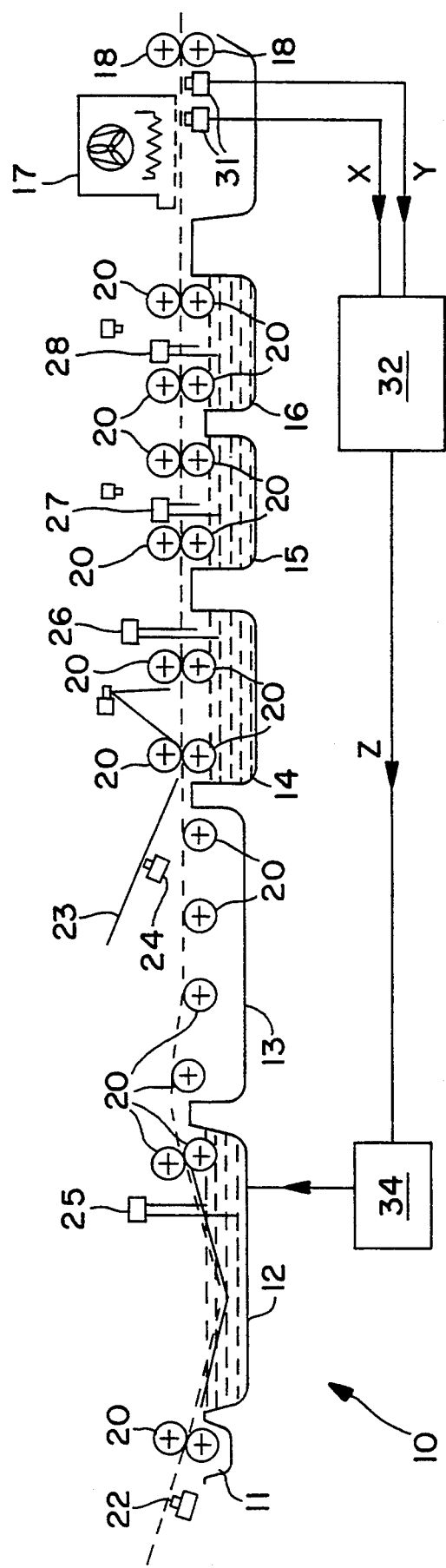
FIG. 1 is a schematic layout of one embodiment of a processing apparatus
  according to the invention.

With reference to FIG. 1 there is illustrated a longitudinal cross-section through an apparatus 10 for processing exposed photographic sheet material, in particular aluminium lithographic printing plates, of the type described in EP-A-410500.

EP-A-410500 discloses an imaging element containing an aluminium support provided with in the order given an image receiving layer containing physical development nuclei, and a photosensitive layer containing a silver halide emulsion. In the document there is disclosed a diffusion transfer reversal process (hereinafter) called DTR-process) for obtaining a lithographic printing plate in which said imaging element is image-wise exposed and subsequently developed using a developing liquid or activation liquid in the presence of a silver halide complexing agent. The imaging element is then guided through a diffusion transfer zone so that the silver halide complexes formed during the vevelopment step are allowed to diffuse into the image-receiving layer where they are converted to silver. When the imaging element leaves the diffusion transfer zone a silver image is formed in the image receiving layer. The now useless photosensitive layer and optional other layers above the image receiving layer are then removed by rinsing the imaging element in a washing section. Finally the element now carrying a silver image on its surface is treated with a finishing liquid that contains so called hydrophobizing agent for improving the hydrophobicity of the silver image.

In the above described method for obtaining an aluminium based lithographic printing plate according to the DTR-process generally three different liquids are used i.e. a developing or activating liquid, a rinsing liquid and a finishing liquid.

The apparatus 10 is mounted within a generally rectangular housing which may include a rectangular metal frame (not shown) for supporting the various parts of the apparatus. The apparatus comprises a sheet feed means 11, preferably a pair of rollers, a developing section 12, a diffusion transfer section 13, a wash section 14, a rinse section 15, a finishing section 16, a drier 17, and output rollers 18. All these sections include conveyor rollers 20 and are linked by a single drive screw so that all the sections and rollers can operate simultaneously at the same speed, to advance the sheet materials through the apparatus from the feed means 11 to the output rollers 18.

Now in use the developing liquid, rinsing liquid and finishing liquid may be automatically replenished, however, for simplicity the present apparatus will only be described with reference to the replenishment of the developing liquid or activating liquid in the developing section 12.

Figure 2:
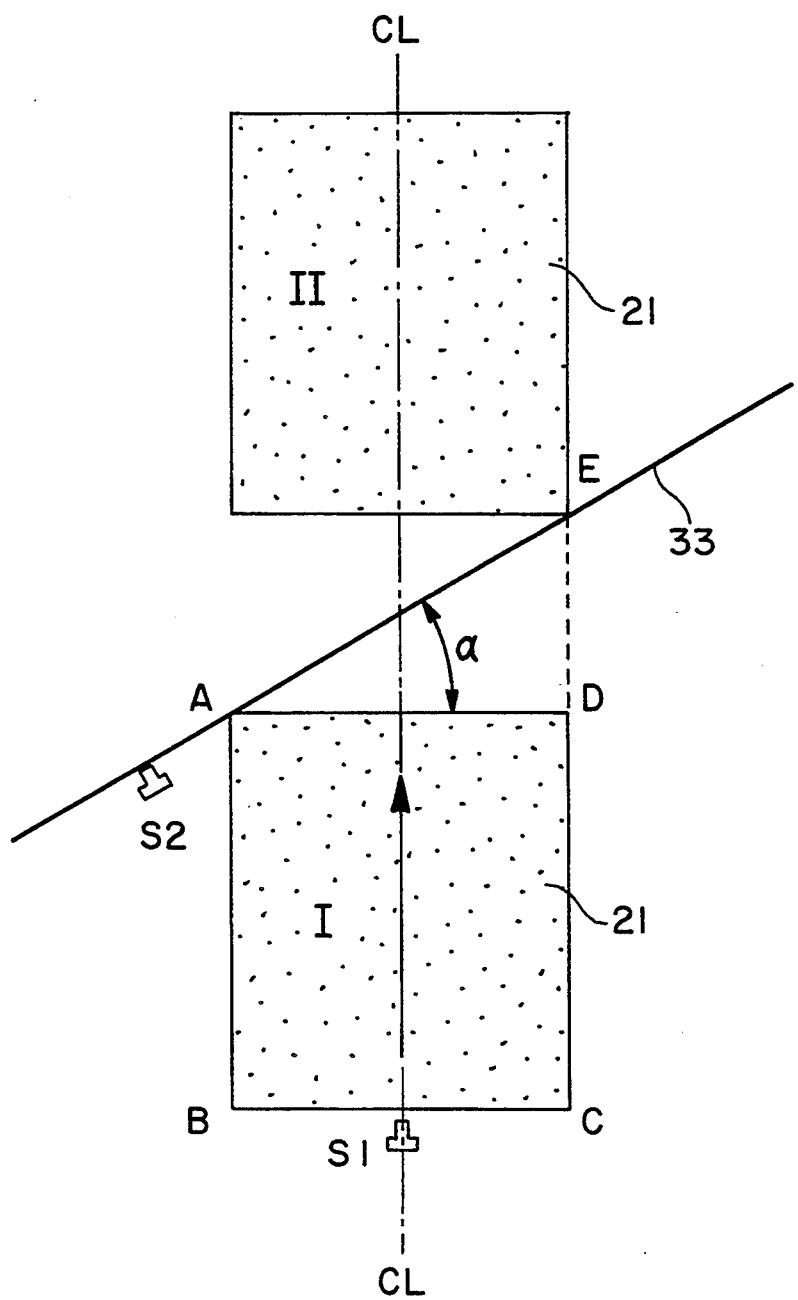
FIG. 2 is a schematic layout showing the relation between a sheet of material and the dual sensor means.

A typical sheet material is an aluminium off-set lithographic plate 21 is shown in FIG. 2, and which has basically a width A-D and a length A-B. Yhese sizes A-B and A-D are lossely based on standard A1, A2, A3, etc., formats and will have maximum dimensions of about 80 cms width and 1 meter length. As the plate 21 is shown in FIG. 2, and which has basically a width A-D and a length A-B. These sizes A-B and A-D are lossely based on standard A1, A2, A3, etc., formats and will have maximum dimensions of about 80 cms width and 1 meter length. As the plate 21 passes through the apparatus 10, the consumption of the chemicals in the various sections 12, 15, 16, directly relates to the area of the plate. The image on the plate generally involves about 10%–25% of the area of the plate and therefore the correlation between chemical consumption and area of the plate 21 passing through the apparatus is good.

In order to measure the area of a plate 21 passing through the apparatus, a measuring device 31 is preferably arranged at the output rollers 18. Other locations in the apparatus could be used particularly the diffusion section.

The measuring device 31 comprises two sensor means S1 and S2 best seen in FIG. 2 and a processor means 32. The first sensor means S1 is arranged approximately the longitudinal centre line of the apparatus and could be an optical sensor, a mechanical sensor, or any other suitable device which can determine the length of a passing plate 21.

A signal X from the first sensor means S1 passes to the process means 32 which can calculate the longitudinal dimension or length of the plate 21 from the process speed and the detection time, (i.e. the time the sensor means 31 is operating).

The second sensor means S2 is arranged on a bias angle A to the longitudinal centre line CL of the apparatus, preferably at an angle of 45 degrees. The second sensor means S2 could be an optical beam, or preferably includes a blade 33 arranged to extend across substantially the whole operational width of the apparatus. The blade is capable of sensing the presence of sheet material and switching on or off as required a signal generator indicating the presence or absence of the sheet material. The sensor S2 is arranged on one side of the sheet feed path, and the blade 33 is preferably arranged beneath the sheet feed path and is biased upwardly by resilient means, preferably spring means, to intercept the sheet path in the absence of a plate but is depressed by the presence of a plate.

The second sensor means S2 sends a signal Y to the process means 32 indicating the detected presence of the plate 21. The principle of operation of the two sensor means S1 and S2 is shown in FIG. 2.

As the plate 21 advances through the apparatus from position I to position II the sensor means S1 scans the length A-B. During its advance the forward edge A-D of the plate 21 will trigger the blade 33 with its corner A on one lateral side A-B of the plate shown at I, and will allow the blade 33 to return to an at-rest condition when back edge B-C with its corner C on the other lateral side CD passes over the blade 33 is shown at II.

The sensor means S1 gives a signal x for derivation of the length A-B of the plate.

The sensor means S2 in effect senses the length E-C. The length E-D = (E-C) − (A-B) and the width A-D of the plate is given by E-D Tan $\alpha$. Preferably $\alpha$ is at least 30 degrees and for convenieunce is 45 degrees since then Tan $\alpha = 1$ so that the width A-D = E-D.

This calculation is preprogrammed into the process means 32 which is a microprocessor. The process means then sends a signal Z corresponding to the calculated surface area of the plate 21 to a replenishment means 34 where the signal Z is utilized to control automatic replenishment of the developing fluid in accordance with the signal.

In order to achieve optimum processing conditions through the machine, any plates 21 should be roughly centralised with respect to the longitudinal centre line of the apparatus. Guide means may be provided to centralize the plates 21.

The apparatus 10 may include a rewash facility 23 for feeding already processed and reworked plates back into the wash section 14. A feed sensor 24 may be located on the rewash facility 23 to sense the presence of plates thereon to prevent the operation of the input rollers 11 until the rewashed plate is processed.

The process conditions within the developing section 12, wash section 14, rinse section 15, and finishing section 16 can be monitored by condition sensors 25, 26, 27 and 28 respectively. In the event that the sensed conditions do not fall within predetermined process parameters operation of the input rollers 11 will be prevented until the process conditions return to required value.

We claim:

1. In an apparatus for the development of exposed rectangular photographic sheet material, said apparatus including conveyor means to advance said material at a known speed in one direction along a rectilinear path with one axis of said material substantially parallel to said path, and a device calculating the surface area of said rectangular sheet material being conveyed, said device including first and second sensor means activated by the advance of the material to generate signals and a signal-processing means for processing signals from the sensor means, the first sensor means generating a time interval signal from which at the known speed the dimension of the sheet material parallel to said path is determined, in combination, the improvement wherein said second sensor means is elongated and extends between upstream and downstream ends thereof relative to the direction of advance, angularly across said path along a generally straight line inclined at a bias angle ($\alpha$) relative to said path, the length of said second sensor means being such that the distance separating the upstream and downstream ends thereof measured perpendicularly to said path being at least as great as the dimension perpendicularly to said path of the largest sheet material to be developed, said second sensor means being operable to generate signals upon the passage by said second sensor means of the leading and trailing corners relative to said angularly extending sensor means of said sheet material, said first sensor means being located at a point separated in the path direction from the upstream end of said second sensor means, whereby said second sensor means measures the time interval between the passage of the leading and trailing corners of said sheet material past said second sensor from which in relation to the time interval as determined by said first sensor means and the speed of advance a distance can be determined parallel to said axis from which in relation to said angle ($\alpha$) the dimension of said sheet material perpendicular to said axis can be determined by trigonometric calculation, and the signal-processing means combines said parallel and perpendicular dimensions of the sheet material to calculate the area of said sheet material and to produce an output signal indicative of the calculated area.

2. Apparatus as claimed in claim 1 characterised in that said bias angle ($\alpha$) is 45 degrees.

3. Apparatus as claimed in claim 1, characterised in that the second sensor means (S2) is completely independant of the first sensor means (S2).

4. Apparatus as claimed in claim 1, for the development of aluminium lithographic offset printing plates.

5. A method for determining the area of moving rectangular sheet material which comprises the steps of advancing said sheet material in one direction along a rectilinear path at a given speed with the sheet material arranged with one axis thereof generally parallel to said path, measuring the dimension of said sheet material parallel to said path, detecting the arrival at a fixed locus extending angularly across said path at a predetermined angle ($\alpha$) of the leading and trailing corners relative to the angular locus of said sheet material to measure the time interval between the arrival of said corners at said locus, calculating from said latter time interval in relation to said given speed the distance measured parallel to said path between the position of said trailing corner when the arrival of said leading corner at said fixed locus is detected and the position of said trailing corner when its arrival at said locus is detected, subtracting from the thus calculated distance the measured dimension of the sheet material parallel to said path gives the length of a side of a right triangle of which the angularly-extending fixed locus is the hypotenuse and said angle ($\alpha$) is the angle, and from the length of said triangle side calculating trigonometrically the dimension of said sheet material measured perpendicularly to said path, and multiplying the parallel dimension by the perpendicular dimension to obtain the area of said sheet material.

6. In an apparatus for the development of exposed rectangular photographic sheet material, said apparatus including conveyor means to advance said material at a known speed in one direction along a rectilinear path with one axis of said material substantially parallel to said path, and a device for the calculation of the surface area of rectangular sheet material being conveyed, said device including first and second sensor means activated by the advance of the material to generate signals and a signal-processing means for processing signals from the sensor means, the first sensor means generating a signal corresponding to the dimension of said material parallel to said path, in combination, the improvement wherein said second sensor means comprises a signal generator operated by an elongated blade arranged to extend angularly across said path at a bias angle ($\alpha$) relative to said path, the length of said elongated blade being such that the distance separating its ends measured perpendicularly to said path is at least as great as the dimension perpendicularly to said path of the largest sheet material to be developed, said elongated blade being adapted to be contacted by a sheet material moving along said path to operate said signal generator to generate a signal corresponding to the distance required for the sheet material to pass said elongated blade, and said signal-processing means utilizes said signals from said first and second sensor means to calculate the area of said sheet material and produces an output signal indicative of the calculated area.

7. Apparatus as claimed in claim 6, wherein said blade is deflectable and is spring-biased to a position intercepting the sheet feed path and is deflected against the spring bias by the passage of a sheet material.

* * * * *